(12) United States Patent
Imai

(10) Patent No.: US 7,413,935 B2
(45) Date of Patent: Aug. 19, 2008

(54) SEMICONDUCTOR DEVICE AND METHOD OF FABRICATING THE SAME

(75) Inventor: Takahiro Imai, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 209 days.

(21) Appl. No.: 11/033,259

(22) Filed: Jan. 12, 2005

(65) Prior Publication Data
US 2005/0158915 A1 Jul. 21, 2005

(30) Foreign Application Priority Data
Jan. 15, 2004 (JP) .............................. 2004-008227

(51) Int. Cl.
*H01L 21/00* (2006.01)
(52) U.S. Cl. .............................. 438/127; 257/E21.503; 257/E21.518
(58) Field of Classification Search .................. 438/127
See application file for complete search history.

(56) References Cited

U.S. PATENT DOCUMENTS

| 6,777,814 B2 | 8/2004 | Iwasaki et al. | |
| 6,855,578 B2 * | 2/2005 | Odegard et al. | ............. 438/120 |
| 6,975,036 B2 * | 12/2005 | Ohuchi | ....................... 257/778 |
| 7,141,452 B2 * | 11/2006 | Sambasivam et al. | ........ 438/118 |
| 2003/0029559 A1 | 2/2003 | Yamada et al. | |
| 2004/0082107 A1 * | 4/2004 | Shi et al. | ..................... 438/108 |
| 2005/0087883 A1 * | 4/2005 | Hwee et al. | .................. 257/778 |

FOREIGN PATENT DOCUMENTS

| CN | 1319636 A | 10/2001 |
| CN | 1427471 A | 7/2003 |
| JP | A 02-007180 | 1/1990 |
| JP | A 11-330162 | 11/1999 |
| JP | A 2002-009111 | 1/2002 |

* cited by examiner

*Primary Examiner*—David A Zarneke
(74) *Attorney, Agent, or Firm*—Oliff & Berridge, PLC

(57) ABSTRACT

A method of fabricating a semiconductor device includes hardening resin at a temperature that is less than or equal to the boiling point of the resin and until the hardening reaction ratio of the resin has reached at least 80%, the resin being disposed between a wiring board which has an interconnecting pattern and a semiconductor chip which has a plurality of electrodes and which is mounted on the wiring board in such a manner that the electrodes are in contact with the interconnecting pattern. A eutectic alloy joint is then formed between the electrodes and the interconnecting pattern.

9 Claims, 3 Drawing Sheets

US 7,413,935 B2

SEMICONDUCTOR DEVICE AND METHOD OF FABRICATING THE SAME

Japanese Patent Application No. 2004-8227, filed on Jan. 15, 2004, is hereby incorporated by reference in its entirety.

BACKGROUND OF THE INVENTION

The present invention relates to a semiconductor device and a method of fabrication the semiconductor device.

A technique that is known in the art involves bringing electrodes of a semiconductor chip and an interconnecting pattern of a wiring board into contact, then maintaining electrical connections between the electrodes and the interconnecting pattern by the force of contraction of a resin. During this process, a highly reliable semiconductor device can be fabricated, provided a firm connection can be ensured between the electrodes and the interconnecting pattern.

BRIEF SUMMARY OF THE INVENTION

According to one aspect of the present invention, there is provided a method of fabricating a semiconductor device, the method comprising:

hardening resin at a temperature that is less than or equal to the boiling point of the resin and until the hardening reaction ratio of the resin has reached at least 80%, the resin being disposed between a wiring board which has an interconnecting pattern and a semiconductor chip which has a plurality of electrodes and which is mounted on the wiring board in such a manner that the electrodes are in contact with the interconnecting pattern; and subsequently forming a eutectic alloy joint between the electrodes and the interconnecting pattern.

According to another aspect of the present invention, there is provided a semiconductor device fabricated by the above-described method.

DETAILED DESCRIPTION OF THE EMBODIMENTS

Following embodiments of the present invention may provide a highly reliable semiconductor device and a method of fabrication such a semiconductor device.

(1) According to one embodiment of the present invention, there is provided a method of fabricating a semiconductor device, the method comprising:

hardening resin at a temperature that is less than or equal to the boiling point of the resin and until the hardening reaction ratio of the resin has reached at least 80%, the resin being disposed between a wiring board which has an interconnecting pattern and a semiconductor chip which has a plurality of electrodes and which is mounted on the wiring board in such a manner that the electrodes are in contact with the interconnecting pattern; and subsequently forming a eutectic alloy joint between the electrodes and the interconnecting pattern.

In this embodiment, the step of hardening the resin is performed at a temperature that is no higher than the boiling point of the resin. For that reason, the hardening of the resin can proceed without the formation of bubbles therein. Since the eutectic alloy joints are formed after the resin has been hardened, the electrodes and the interconnecting pattern can be firmly affixed together. This enables the fabrication of a highly reliable semiconductor device.

(2) In this method of fabricating a semiconductor device, the step of hardening the resin may be performed while the electrodes and the interconnecting pattern are being pressed together.

(3) In this method of fabricating a semiconductor device, the step of hardening the resin may be performed while ultrasonic vibrations are being applied to at least one of the semiconductor chip and the wiring board.

(4) In this method of fabricating a semiconductor device, the step of forming the eutectic alloy joint may be performed while the electrode and the interconnecting pattern are being pressed together.

(5) In this method of fabricating a semiconductor device, the step of forming the eutectic alloy joint may be performed while ultrasonic vibrations are being applied to at least one of the semiconductor chip and the wiring board.

(6) According to one embodiment of the present invention, there is provided a semiconductor device fabricated by the above-described method.

These embodiments will be described below with reference to the drawings. Note that the present invention is not limited to the following embodiments.

An embodiment to which the present invention is applied is described below with reference to the accompanying figures. It should be noted, however, that the present invention is not limited to the embodiment described below.

Figure 1:
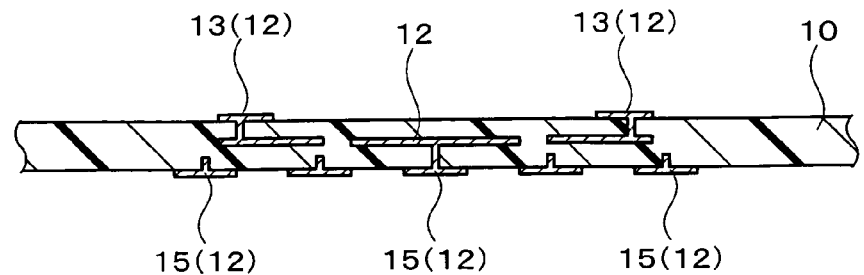
FIG. 1 is illustrative of a method of fabricating a semiconductor device according to one embodiment of the present invention.

A method of fabricating a semiconductor device according to one embodiment of the present invention is illustrated in FIGS. 1 to 6. The method of fabricating a semiconductor device in accordance with this embodiment could also include the provision of a wiring board 10. FIG. 1 is illustrative of the wiring board 10. The material of the wiring board 10 is not specifically limited, and thus it could be of an organic material (such as an epoxy substrate), an inorganic material (such as a ceramic or glass substrate), or of a composite structure (such as a glass-epoxy substrate). The wiring board 10 could also be a rigid substrate, in which case the wiring board 10 would be called an interposer. Alternatively, the wiring board 10 could be a flexible substrate such as a polyester substrate or polyimide substrate. In addition, the wiring board 10 could be a substrate for chip-on-film (COF) packaging. The wiring board 10 could be a single-layer substrate formed from just one layer, or it could be a multi-layer substrate having a plurality of layers in a stack. The shape and thickness of the wiring board 10 are also not specifically limited.

The wiring board 10 has an interconnecting pattern 12 (see FIG. 1). The interconnecting pattern 12 could be formed of one or a plurality of layers of any of: copper (Cu), chrome (Cr), titanium (Ti), nickel (Ni), titanium tungsten (TiW), gold (Au), aluminum (Al), nickel vanadium (NiV), and tungsten (W). The interconnecting pattern 12 could also be formed in such a manner that there are electrical connections between one surface of the wiring board 10 and the other surface thereof. The interconnecting pattern 12 could also be formed to have pads 13 and 15, as shown in FIG. 1 by way of example. In such a case, each pad 13 is a pad provided on one surface of the wiring board 10 while each pad 15 is a pad provided on the other surface of the wiring board 10. Electrical connections between the two surfaces of the wiring board 10 can be designed by providing electrical connections between the pads 13 and the pads 15. Note that the pads 13 and 15 in this case are also included in the designation of the interconnecting pattern 12. If a multi-layer substrate is prepared as the wiring board 10, the interconnecting pattern 12 could also be provided between the layers thereof. Note that the method of forming the interconnecting pattern 12 is not specifically limited. For example, the interconnecting pattern 12 could be formed by sputtering or a similar method, or an additive method that forms the interconnecting pattern 12 by non-electrolytic plating could be employed. The interconnecting pattern 12 (the pads 13 and 15) could also be formed by plating with solder, tin, or gold, or the like.

Figure 2:
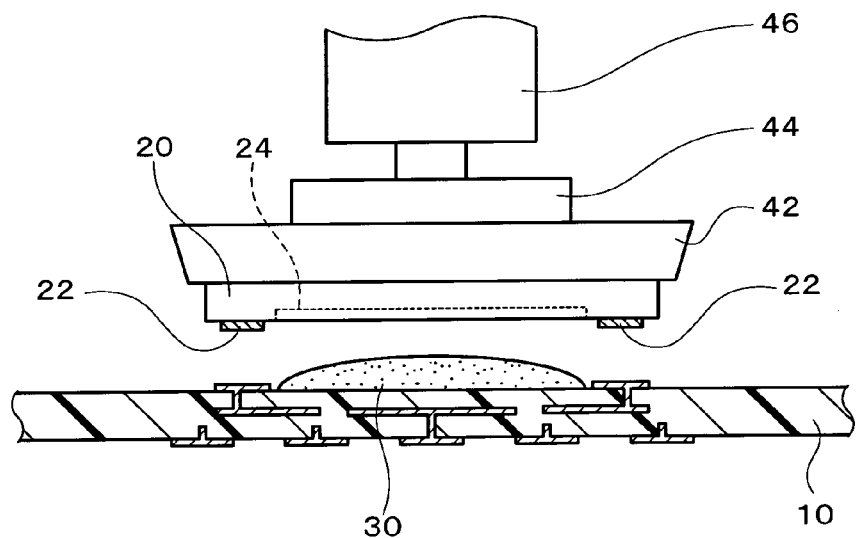
FIG. 2 is illustrative of a method of fabricating a semiconductor device according to one embodiment of the present invention.
Figure 3:
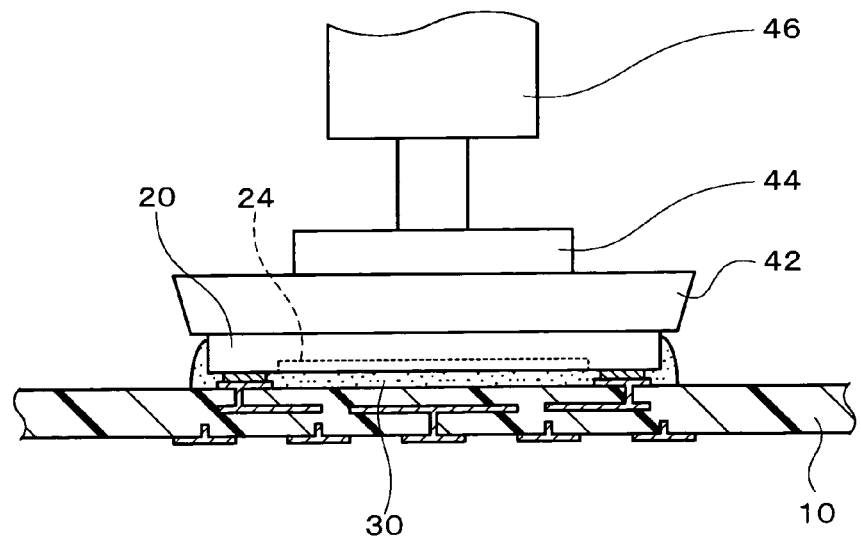
FIG. 3 is illustrative of a method of fabricating a semiconductor device according to one embodiment of the present invention.

The method of fabricating a semiconductor device in accordance with this embodiment could also include the steps of mounting a semiconductor chip 20 on the wiring board 10, as shown in FIGS. 2 and 3. The semiconductor chip 20 has a plurality of electrodes 22. Each electrode 22 could be connected electrically to the interior of the semiconductor chip 20. The semiconductor chip 20 could have integrated circuitry 24 formed of components such as transistors and memory elements, and the electrodes 22 could be connected electrically to the integrated circuitry 24. In this method of fabricating a semiconductor device, the semiconductor chip 20 is mounted with the electrodes 22 in contact with the interconnecting pattern 12 (the pads 13). As shown by way of example in FIG. 2, the semiconductor chip 20 is held by a bonding tool 42 and is positioned in such a manner that the electrodes 22 thereof face the interconnecting pattern 12. The electrodes 22 and the interconnecting pattern 12 could be placed into contact by pressing the bonding tool 42 downward towards the wiring board 10, as shown in FIG. 3. In this method of fabricating a semiconductor device, the semiconductor chip 20 is mounted on the wiring board 10 after resin 30 is provided therebetween, as shown in FIG. 2. In other words, the semiconductor chip 20 could be mounted while the resin 30 is being pressed outward by the semiconductor chip 20. Thus the resin 30 could be provided between the wiring board 10 and the semiconductor chip 20, as shown in FIG. 3. During this time, a resin in paste form could be used as the resin 30, as shown in FIG. 2. It should be noted, however, that a resin in the form of a film (not shown in the figure) could be employed instead. The material of the resin 30 is not specifically limited and thus any of various known materials can be used therefor. The resin 30 could be a resin (such as NCF or NCP) that does not comprise conductive particles. Note that the method of providing the resin 30 is not limited thereto. For example, the resin 30 could be injected in between the wiring board 10 and the semiconductor chip 20 after the semiconductor chip 20 has been mounted on the wiring board 10.

Figure 4:
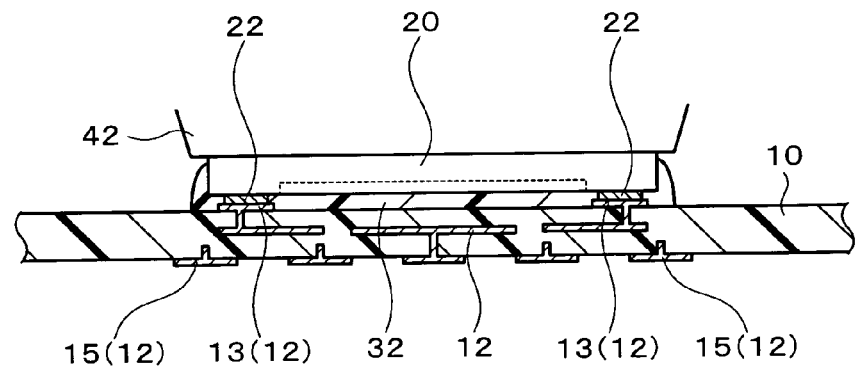
FIG. 4 is illustrative of a method of fabricating a semiconductor device according to one embodiment of the present invention.

The method of fabricating a semiconductor device in accordance with this embodiment includes a step of causing the resin 30, which is provided between the wiring board 10 and the semiconductor chip 20, to harden up to a hardening reaction ratio of at least 80%, at a temperature that is no higher than the boiling point of the resin 30. This hardening of the resin 30 could form a resin portion 32, as shown in FIG. 4. In general, if the hardening reaction ratio of the resin exceeds 80%, it will become difficult to remove bubbles that are comprises therein. However, in this method of fabricating a semiconductor device, the resin 30 is heated to a temperature that is no higher than the boiling point thereof, to harden it. For that reason, the resin 30 can be hardened without any bubbles forming. This makes it possible to form the resin portion 32 with no bubbles therein. The bonding tool 42 could be heated by means such as a heater 44 (see FIG. 3) so that the heat thereof causes the resin 30 to harden. The step of hardening the resin 30 could be done while the electrodes 22 of the semiconductor chip 20 and the interconnecting pattern 12 (the pads 13) are being pressed together. This ensures that the resin 30 can be prevented from remaining between the electrodes 22 and the interconnecting pattern 12, thus enabling the fabrication of a semiconductor device that is highly reliable electrically. The semiconductor chip 20 could be pressed towards the wiring board 10 by a pressure applicator 46 (see FIG. 3), to press the electrodes 22 and the interconnecting pattern 12 together. Alternatively, the step of hardening the resin 30 could be done while ultrasonic vibrations are applied. Since this also ensures that the resin 30 is prevented from remaining between the electrodes 22 and the interconnecting pattern 12, it enables the fabrication of a semiconductor device that is highly reliable electrically. The ultrasonic vibrations could be applied by causing the bonding tool 42 to vibrate by an ultrasonic vibration device (not shown in the figure). Alternatively, the ultrasonic vibrations could be applied by causing a support stand (not shown in the figure) to vibrate.

Figure 5:
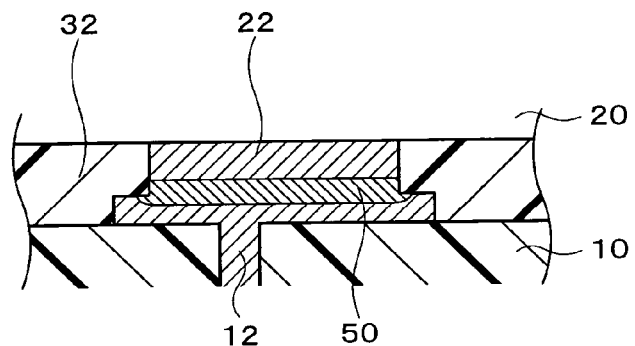
FIG. 5 is illustrative of a method of fabricating a semiconductor device according to one embodiment of the present invention.

The method of fabricating a semiconductor device in accordance with this embodiment includes a step of forming a eutectic alloy joint between the electrodes 22 and the interconnecting pattern 12. As shown in FIG. 5, a eutectic alloy layer 50 could be formed by the electrodes 22 and the interconnecting pattern 12. In other words, the electrodes 22 and the interconnecting pattern 12 could be brought into contact and heated, to form the eutectic alloy layer 50 therebetween (see FIG. 5). During this time, the eutectic alloy layer 50 could be formed by the leading edge surface of each electrode 22 and the surface of the interconnecting pattern 12 (which could be a plated layer). This ensures a firm joint between each electrode 22 and the interconnecting pattern 12, enabling the fabrication of a highly reliable semiconductor device. Note that the eutectic alloy layer 50 could be formed by heating to a temperature that is at least as high as the boiling point of the resin 30. The type of eutectic alloy that configures the eutectic alloy layer 50 is determined by the material of the electrodes 22 and the material of the interconnecting pattern 12 (or a plated layer thereon, which is not shown in the figures). The eutectic alloy that forms the eutectic alloy layer 50 could be an Au—Au alloy or an Au—Sn alloy, but it is not particularly limited thereto. Note that this step is formed after the step of hardening the resin 30. In other words, the resin portion 32 is formed by hardening the resin 30 before the step of forming a eutectic alloy. This ensures that the state in which the electrodes 22 face the interconnecting pattern 12 (the pads 13) can be maintained even when heat is applied for forming the eutectic alloy, enabling the simple fabrication of a highly reliable semiconductor device. Note that the step could also be performed while the electrodes 22 and the interconnecting pattern 12 are being pressed into contact. Alternatively, the step of forming the eutectic alloy joint could be performed while ultrasonic vibration are being applied thereto. Since this process makes it possible to form a stable eutectic alloy, it enables the fabrication of a highly reliable semiconductor device.

Figure 6:
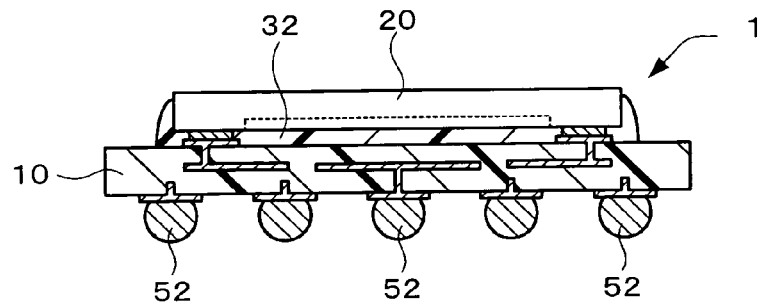
FIG. 6 is illustrative of a method of fabricating a semiconductor device according to one embodiment of the present invention.
Figure 7:
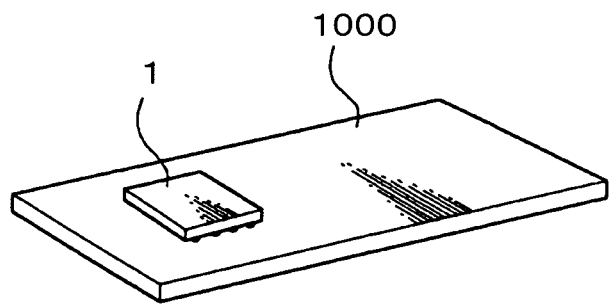
FIG. 7 shows a circuit board on which is mounted a semiconductor device according to one embodiment of the present invention.
Figure 8:
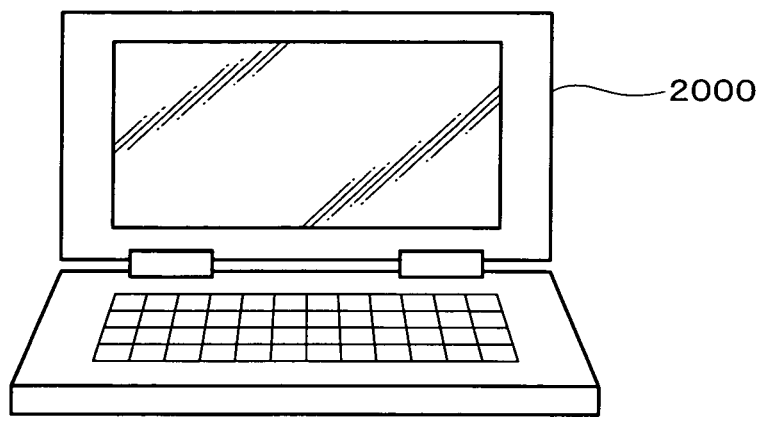
FIG. 8 shows an electronic instrument having a semiconductor device according to one embodiment of the present invention.
Figure 9:
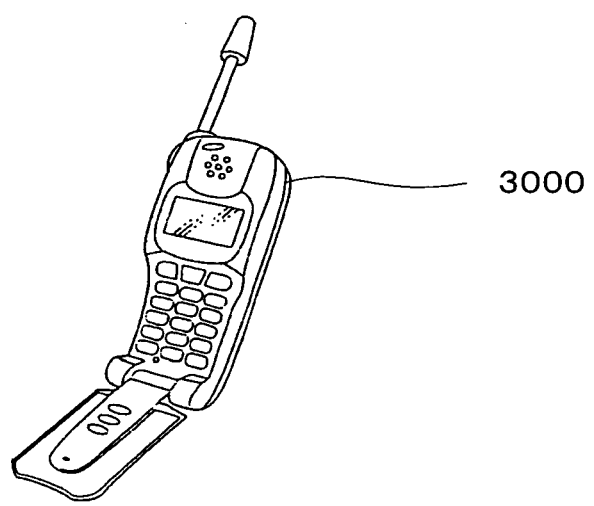
FIG. 9 shows an electronic instrument having a semiconductor device according to one embodiment of the present invention.

A semiconductor device 1 shown in FIG. 6 could be fabricated by further steps such as a step of completely hardening the resin 30, a step of providing external terminals 52 on the interconnecting pattern 12 (the pads 15), an inspection step, and a punching-out step. A circuit board 1000 on which is mounted the semiconductor device 1 is shown in FIG. 7. A notebook personal computer 2000 shown in FIG. 8 and a portable phone 3000 shown in FIG. 9 are examples of electronic instruments having a semiconductor device that is fabricated by the method of fabricating a semiconductor device in accordance with this embodiment.

Although only some embodiments of the present invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A method of fabricating a semiconductor device, the method comprising:

hardening resin at a first temperature that is less than or equal to the boiling point of the resin and until the hardening reaction ratio of the resin has reached at least 80%, the resin being disposed between a wiring board which has an interconnecting pattern and a semiconductor chip which has a plurality of electrodes and which is mounted on the wiring board in such a manner that the electrodes are in contact with the interconnecting pattern; and subsequently forming a eutectic alloy joint between the electrodes and the interconnecting pattern at a second temperature which is higher than the boiling point of the resin.

2. The method of fabricating a semiconductor device as defined in claim 1, wherein the step of hardening the resin is performed while the electrodes and the interconnecting pattern are being pressed together.

3. The method of fabricating a semiconductor device as defined in claim 1, wherein the step of hardening the resin is performed while ultrasonic vibrations are being applied to at least one of the semiconductor chip and the wiring board.

4. The method of fabricating a semiconductor device as defined by claim 1, wherein the step of forming the eutectic alloy joint is performed while the electrode and the interconnecting pattern are being pressed together.

5. The method of fabricating a semiconductor device as defined in claim 1, wherein the step of forming the eutectic alloy joint is performed while ultrasonic vibrations are being applied to at least one of the semiconductor chip and the wiring board.

6. The method of fabricating a semiconductor device as defined in claim 2, wherein the step of hardening the resin is performed while ultrasonic vibrations are being applied to at least one of the semiconductor chip and the wiring board.

7. The method of fabricating a semiconductor device as defined by claim 2, wherein the step of forming the eutectic alloy joint is performed while the electrode and the interconnecting pattern are being pressed together.

8. The method of fabricating a semiconductor device as defined by claim 2, wherein the step of forming the eutectic alloy joint is performed while ultrasonic vibrations are being applied to at least one of the semiconductor chip and the wiring board.

9. The method of fabricating a semiconductor device as defined by claim 2, wherein the step of hardening the resin is performed without producing a bubble in the resin.

* * * * *